United States Patent [19]

Imai et al.

[11] Patent Number: 5,001,452

[45] Date of Patent: Mar. 19, 1991

[54] SEMICONDUCTING DIAMOND AND PROCESS FOR PRODUCING THE SAME

[75] Inventors: Takahiro Imai; Hideaki Nakahata; Naoji Fujimori, all of Hyogo, Japan

[73] Assignee: Sumitomo Electric Industries, Ltd., Osaks, Japan

[21] Appl. No.: 201,151

[22] Filed: Jun. 2, 1988

[30] Foreign Application Priority Data

Jun. 2, 1987 [JP] Japan ................................ 62-137700
Jun. 2, 1987 [JP] Japan ................................ 62-137701
Oct. 16, 1987 [JP] Japan ................................ 62-262535

[51] Int. Cl.$^5$ ............................................. H01C 7/00
[52] U.S. Cl. ..................................... 338/13; 29/610.1; 264/349
[58] Field of Search ............. 420/903; 338/13; 357/7, 357/8, 85, 65, 63, 64, 51, 23.7, 2; 29/610.1; 264/82, 83, 104, 349

[56] References Cited

U.S. PATENT DOCUMENTS 4,484,212  11/1984  Komatsu et al. ................. 338/13 X
4,806,900  2/1989  Fujimori et al. ................. 338/22 R Primary Examiner—Bruce A. Reynolds
Assistant Examiner—Marvin M. Lateef
Attorney, Agent, or Firm—Sughrue, Mion, Zinn, Macpeak & Seas

[57] ABSTRACT

A semiconducting diamond which contains diamond carbon and at least one dopant element selected from the group consisting of S, Se, and Cl, and a process for producing the same.

13 Claims, No Drawings

SEMICONDUCTING DIAMOND AND PROCESS FOR PRODUCING THE SAME

FIELD OF THE INVENTION

The present invention relates to a semiconducting diamond suitable for use in electronic devices.

BACKGROUND OF THE INVENTION

Diamond which has a band-gap energy of 5.5 eV is inherently a good electric insulator. It is desirable to dope diamond, like Si and Ge, with impurities, thereby introducing either p- or n-type semiconducting characteristics in the diamond.

As a matter of fact, some natural diamonds, although rare, are p-type semiconducting diamonds containing boron and are referred to as type IIb diamond. This type IIb diamond can be synthesized by a super-high pressure process. However, there is no naturally occurring diamond which exhibits the properties of an n-type semiconductor, nor has the synthesis of n-type semiconducting diamond by the super-high pressure process been accomplished.

Type IIb diamonds are described, e.g., in A. S. Vishnevskil, A. G. Gontar, "Electrical conductivity of heavily doped p-type diamond", *Sov. Phys. Semicond.*, vol. 15(6), p. 659 (June 1981); A. S. Vishnevskil, A. G. Gontar, "Electrical conducting of heavily doped p-type diamond", ditto., vol. 11(10) (October 1977); G. N. Bezrukov, L. S. Smirnov, "Some electrical and optical properties of synthetic semiconducting diamonds doped with boron", ditto., vol. 4(4), p. 587 (October 1970); J. J. Hauser, J. R. Patel, "Hopping conductivity in C implanted amorphous diamond, or how to ruin a perfectly good diamond", *Solid State Communications*, vol. 18, p. 789 (1976); I. G. Austin, R. Wolfe, "Electrical and optical properties of a semiconducting diamond", *Proc. Phys. Soc.*, p.329 (1956); P. T. Wedepohl, "Electrical and optical properties of type IIb diamonds", ditto., p.177 (1957); A. T. Collins, A. W. S. Williams, "The nature of the acceptor centre in semiconducting diamond", *J. Phys. C: Solid St. Phys.*, vol. 4, p.1789 (1971); and V. S. Vavilov, "Ion implantation into diamond", *Radiation Effects*, vol. 37, p. 229 (1978).

An n-type semiconducting diamond is indispensable to the fabrication of semiconducting diamond devices which depend on a p-n junction for their successful operation. Several attempts have been made to dope diamond with impurities by the super-high pressure synthesis process or ion implantation but none has succeeded in synthesizing an n-type semiconducting diamond having low electrical resistivity and high electron mobility.

The attempts to make an n-type semiconducting diamond are described, e.g., in V. S. Vavilov, E. A. Konorova, "Electric properties of diamond doped by implantation of lithium", *Sov. Phys. Semicond.*, vol. 13(6), p. 635 (1979); V. S. Vavilov, E. A. Konorova, "Conductivity of diamond doped by implantation of phosphorus", ditto., vol. 9(8), p.962 (1976); V. S. Vavilov, E. A. Konorova, "Implantation of antimony ions into diamond", ditto., vol. 6(12), p.1998 (1972); and Jacques C. Bdurgoin, "Study of defects introduced by ion implantation in diamond", *J.J.A.P.*, vol. 14(4), P. 544 (1975).

SUMMARY OF THE INVENTION

An object, of the present invention is to provide an n-type semiconducting diamond and a process for producing the same.

Other objects of the present invention will be apparent from the following description.

It has now been found that the above objects of the present invention can be attained by a semiconducting diamond comprising diamond carbon and at least one dopant selected from the group consisting of S, Se, and Cl.

DETAILED DESCRIPTION OF THE INVENTION

In the present invention, the dopants, i.e., S, Se, and Cl may be used singly or in combination of two or three thereof. The mixing ratio of the dopants can be determined optionally.

Instead of conventional group V element dopants such as P and As, the present invention uses as dopants S and/or Se which is a group VI element and/or Cl which is a group VII element. As a result of various experiments and reviews conducted on these dopants, the present inventors have found that diamond containing S, Se, or Cl can be synthesized by metastable vapor phase deposition, single-crystal growth at super-high pressures, or ion implantation.

The dopant element in the semiconducting diamond of the present invention is preferably present in a concentration of from about $1 \times 10^{12}$ to $1 \times 10^{21}$ cm$^{-3}$. If the dopant concentration is less than about $1 \times 10^{12}$ cm$^{-3}$, the synthesized diamond has too high an electrical resistance to be used as a semiconductor. If the dopant concentration exceeds about $1 \times 10^{21}$ cm$^{-3}$, the crystalline structure of the synthesized product deviates from that of diamond and becomes more like graphite. More preferably, the dopant concentration is from $1 \times 10^{15}$ to $1 \times 10^{20}$ cm$^{-3}$ in view of the application of the semiconducting diamond of the present invention to functional devices.

The semiconducting diamond of the present invention can be synthesized by either one of the following methods: (1) metastable vapor phase deposition using a starting gas in which the ratio of the number of atoms of a dopant element to that of carbon atoms (dopant element/C) ranges from about 0.001% to 10%; (2) the super-high pressure process; and (3) ion implantation.

These methods (1), (2), and (3) are known in the art and can be applied to the present invention.

The metastable vapor deposition method (1) can be attained by the steps of:

(a) mixing a gas comprising carbon and at least one gas comprising a dopant selected from S, Se, and Cl, the molar ratio of the dopant atoms to said carbon atoms being from about 0.001 to 10%; and (b) reacting said mixture to produce a semiconducting diamond comprising diamond carbon and the dopant, as described, e.g., in *Kinzoku Muki Zairyo* (Metallic and Inorganic materials), vol. 2, p.518 (1980), National Research Institute for Metals Japan and National Research Institute for Inorganic materials Japan; and *Kinzoku Muki Kobunshi Zairyo* (Metallic, Inorganic, and Macromolecular Materials), vol. 6, p. 666 (1984), National Research Institute for Metals Japan, National Research Institute for Inorganic Materials Japan, and National Research Institute for Macromolecules Japan.

The super-high pressure method (2) can be attained by the steps of:

(a) mixing a diamond powder and at least one substance comprising a dopant selected from the group consisting of S, Se, and Cl; and (b) reacting said mixture at a temperature and pressure sufficient to provide a semiconducting diamond comprising diamond carbon and the dopant, as described, e.g., in *Kinzoku Muki Zairyo* (Metallic and Inorganic materials), vol. 2, p. 457 (1980), National Research Institute for Metals Japan and National Research Institute for Inorganic materials Japan; and *Kinzoku Muki Kobunshi Zairyo* (Metallic, Inorganic, and Macromolecular Materials), vol. 6, p. 643 (1984), National Research Institute for Metals Japan, National Research Institute for Inorganic Materials Japan, and National Research Institute for Macromolecules Japan.

The ion implantation method (3) can be attained by the step of injecting an ionized substance comprising a dopant selected from the group consisting of S, Se, and Cl into a carbon diamond matrix to provide a semiconducting diamond doped with the dopant in an amount of from about $1 \times 10^{12}$ to $1 \times 10^{17}$ ions per 1 cm$^3$ of said semiconducting diamond, as described, e.g., in M. Iwaki, *IONICS*. April 1983, p.39.

A semiconducting diamond containing Cl as a dopant element according to the present invention can be synthesized by method (1) or (3). When it was attempted to synthesize Cl-doped diamond by metastable vapor phase deposition, the super-high pressure process, and ion implantation, Cl-containing n-type semiconducting diamond could be synthesized by both metastable vapor phase deposition and ion implantation, but not by the super-high pressure process. There was no essential difference in the properties of the Cl-doped semiconducting diamonds whether they were synthesized by metastable vapor phase deposition or by ion implantation.

A semiconducting diamond containing S or Se as a dopant element according to the present invention can be synthesized by any of the three methods (1) to (3) mentioned above. These was no essential difference in the properties of the S- or Se-doped semiconducting diamonds whether they were synthesized by method (1), (2), or (3).

Diamond is composed of covalently bonded atoms of carbon as a group IV element. If S or Se which is a group VI element is introduced in diamond and replaces as an impurity one of the carbon atoms of the lattice, the impurity has two free electrons in its outermost shell that do not participate in covalent bonding. Without being bound by theory, these electrons serving as donors are believed to contribute to the n-type semiconducting properties of the diamond. In other words, S or Se introduced in the diamond as a dopant creates a donor level in the inhibition band. In certain cases, S or Se might cause a Frenkel defect (e.g., the simultaneous presence of one vacancy and one interstitial impurity atom) rather than substitution in regular carbon lattice sites, and this may also serve to create donor levels.

In fact, the present inventors have synthesized S- or Se-doped diamonds and successfully have confirmed that these diamonds exhibit n-type semiconducting properties.

The semiconducting diamond of the present invention preferably has an electrical resistivity of from about $1 \times 10^{-2}$ to $1 \times 10^6$ Ωcm, a free electron density of from about $1 \times 10^{12}$ to $1 \times 10^{21}$ cm$^{-3}$, and an electron mobility of from about $1 \times 10^{-1}$ to $1 \times 10^3$ cm$^2$/Vsec.

When synthesizing the semiconducting diamond of the present invention by metastable vapor phase deposition, the starting gas is preferably conditioned in such a way that the ratio of the number of atoms of the dopant element to carbon atoms (dopant element/C) is within the range of about 0.001% to 10%. If the ratio dopant element/C is within this range, the synthesized diamond will have a dopant element concentration in the range of about $1 \times 10^{12}$ to $1 \times 10^{21}$ (cm$^{-3}$) which contributes effective semiconducting properties to the diamond.

In the present invention, various C, S, Se, and Cl sources can be used in a starting gas. Examples of the C sources include hydrocarbons such as $CH_4$, $C_2H_6$, and $C_3H_8$, and alcohols such as $CH_3OH$ and $C_2H_5OH$. Examples of the S sources include $H_2S$, $CS_2$, $SO_2$, and $SF_6$. Examples of the Se sources include $H_2Se$ and $SeO_2$. Examples of the Cl sources include HCl, $CCl_4$, and $CHCl_3$.

Various conventional techniques can be used in synthesizing diamond by metastable vapor phase deposition according to the present invention. The microwave plasma-assisted CVD (chemical vapor deposition) process is one example; in this method, a reaction gas is fed to a chamber which is also supplied with magnetron-oscillated microwaves via a rectangular waveguide, and the reaction gas in the chamber is discharged by the microwaves to cause a diamond synthesis reaction.

When synthesizing a Cl-doped semiconducting diamond by ion implantation, a suitable ion source such as $CCl_4$ is supplied and Cl ions are injected into the diamond matrix in a quantity of about $10^{12}$ to $10^{17}$ ions per square centimeter. This method has the advantage that the depth to which impurities are injected can be precisely controlled by adjusting the acceleration voltage.

The semiconducting diamond of the present invention is an n-type semiconductor with good characteristics, that has so far been unattainable. Therefore, this semiconducting diamond has a potential application to the fabrication of semiconducting diamond devices using a p-n junction, a Schottky contact, an MIS structure or the like.

Other potential applications of the semiconducting diamond of the present invention include fabrication of thermistors and formation of diamond coating films which are required to have electrical conductivity. In these applications, polycrystalline diamond will suffice for the purpose.

Besides the potential for use in a wide range of applications, the semiconducting diamond of the present invention has the additional advantage that it can be easily obtained by employing known techniques.

The specific conditions and methods for synthesizing the semiconducting diamond of the present invention by either metastable vapor phase deposition, the super-high pressure process, or ion implantation are described in the following examples which are given here for illustrative purposes only and are not to be construed as limiting the scope of the present invention. Unless otherwise indicated, all parts, percents and ratios are by weight.

EXAMPLE 1

Using a reaction gas composed of 0.5% of $CH_4$, 0.000005% to 0.005% of $H_2S$, and the balance of $H_2$, S-doped diamond films having a 0.5 μm thickness were grown on the (100) face of a single crystal diamond substrate in accordance with the present invention by a known microwave plasma-assisted CVD process. The pressure in the reaction system was held at 30 Torr and the microwaves applied had a frequency of 2.45 GHz and an output of 350W.

Measurements of electrical resistance and Hall coefficient showed that the S-doped epitaxial diamond films grown in Example 1 had negative Hall coefficient values and hence were n-type semiconductors. The concentration of S in the diamond samples was also measured by SIMS (secondary ion mass spectrometry). The results of S/C (%) calculation, and measurements of free electron density, electron mobility, and S concentration are summarized in Table 1 below. The S concentrations of sample Nos. 1-1 and 1-2 were estimated from their free electron densities.

TABLE 1

| Sample No. | S/C (%) | Free electron density (1/cm$^3$) | Electron mobility (cm$^2$/V · s) | S concentration (1/cm$^3$) |
|---|---|---|---|---|
| 1-1 | 0.001 | $5.9 \times 10^{10}$ | 590 | $10^{12}$ (estimated) |
| 1-2 | 0.005 | $4.4 \times 10^{12}$ | 430 | $10^{14}$ (estimated) |
| 1-3 | 0.01 | $2.6 \times 10^{13}$ | 400 | $10^{15}$ |
| 1-4 | 0.02 | $4.9 \times 10^{14}$ | 270 | $10^{13}$ |
| 1-5 | 0.05 | $5.3 \times 10^{15}$ | 150 | $10^{17}$ |
| 1-6 | 0.1 | $8.1 \times 10^{15}$ | 120 | $10^{17}$ |
| 1-7 | 0.5 | $1.7 \times 10^{17}$ | 80 | $10^{19}$ |
| 1-8 | 1.0 | $3.2 \times 10^{18}$ | 30 | $10^{20}$ |

EXAMPLE 2

A mixture of diamond powder and S was dissolved in an Fe-Ni solvent. The solution was maintained under conditions of ca. 1,400° C. at 5 GPa for 7 hours and samples of S-doped single crystal diamond within the scope of the present invention were synthesized by this super-high pressure process. The electrical resistivity and the Hall coefficient were measured in the same manner as in Example 1, they all had negative Hall coefficient values. Determination was also made for S/C (%) (the ratio of the number of S atoms to C atoms in the starting gas), free electron density, electron mobility, and S concentration, and the results are summarized in Table 2. The S concentration of sample No. 2-1 was estimated from its free electron density.

TABLE 2

| Sample No. | S/C (%) | Free electron density (1/cm$^3$) | Electron mobility (cm$^2$/V · s) | S concen tration (1/cm$^3$) |
|---|---|---|---|---|
| 2-1 | 0.001 | $3.5 \times 10^{10}$ | 490 | $10^{12}$ (estimated) |
| 2-2 | 0.01 | $1.1 \times 10^{11}$ | 370 | $10^{13}$ |
| 2-3 | 0.1 | $4.7 \times 10^{13}$ | 160 | $10^{16}$ |
| 2-4 | 1.0 | $3.6 \times 10^{16}$ | 80 | $10^{18}$ |
| 2-5 | 5.0 | $7.3 \times 10^{18}$ | 20 | $10^{20}$ |

EXAMPLE 3

An S-doped diamond was synthesized by implanting S ions into a single crystal diamond under the following conditions: an S acceleration voltage of 150 keV and an S injection of $10^{15}$ ions/cm$^2$. After annealing under vacuum, the S-doped diamond was subjected to Hall coefficient and resistivity measurements in the same manner as in Example 1. The diamond was found to be an n-type semiconductor since it had a negative Hall coefficient value. The S-injected portion of the diamond had an average free electron density of $10^{16}$ (1/cm$^3$) and an electron mobility of 40 (cm$^2$/V.s).

EXAMPLE 4

According to the present invention, Se-doped diamond films having a 0.5 μm thickness were grown in the same manner as in Example 1 except that H$_2$S was replaced by H$_2$Se.

Measurements of electrical resistivity and Hall coefficient showed that the Se-doped epitaxial diamond films grown in Example 4 had negative Hall coefficient values and hence were n-type semiconductors.

The concentration of Se in the diamond samples was also measured by SIMS. The results of Se/C (%) calculation, and measurements of free electron density, electron mobility, and Se concentration are summarized in Table 3 below. The Se concentrations of sample Nos. 4-1 and 4-2 were estimated from their free electron densities.

TABLE 3

| Sample No. | Se/C (%) | Free electron density (1/cm$^3$) | Electron mobility (cm$^2$/V · s) | S concentration (1/cm$^3$) |
|---|---|---|---|---|
| 4-1 | 0.001 | $9.1 \times 10^{10}$ | 380 | $10^{12}$ (estimated) |
| 4-2 | 0.005 | $5.2 \times 10^{11}$ | 410 | $10^{13}$ |
| 4-3 | 0.01 | $1.1 \times 10^{12}$ | 200 | $10^{14}$ |
| 4-4 | 0.02 | $3.3 \times 10^{12}$ | 180 | $10^{15}$ |
| 4-5 | 0.05 | $7.6 \times 10^{14}$ | 110 | $10^{17}$ |
| 4-6 | 0.1 | $8.1 \times 10^{15}$ | 70 | $10^{18}$ |
| 4-7 | 0.5 | $2.3 \times 10^{17}$ | 20 | $10^{19}$ |
| 4-8 | 1.0 | $2.9 \times 10^{17}$ | 10 | $10^{19}$ |

EXAMPLE 5

Se-doped diamonds were synthesized in the same manner as in Example 2 except that S was replaced by Se.

Electrical resistivity and Hall coefficient measurements were conducted on these samples in the same manner as in Example 1; they all had negative Hall coefficient values and were found to be n-type semiconductors. Determination was also made for Se/C (%) (the ratio of the number of S atoms in the starting gas), free electron density, electron mobility, and Se concentration, and the results are summarized in Table 4. The Se concentration of sample No. 5-1 was estimated from its free electron density.

TABLE 4

| Sample No. | Se/C (%) | Free electron density (1/cm$^3$) | Electron mobility (cm$^2$/V · s) | S concentration (1/cm$^3$) |
|---|---|---|---|---|
| 5-1 | 0.001 | $7.5 \times 10^{10}$ | 430 | $10^{12}$ (estimated) |
| 5-2 | 0.01 | $1.9 \times 10^{12}$ | 290 | $10^{14}$ |
| 5-3 | 0.1 | $9.3 \times 10^{12}$ | 80 | $10^{16}$ |
| 5-4 | 1.0 | $6.6 \times 10^{15}$ | 90 | $10^{18}$ |
| 5-5 | 5.0 | $8.9 \times 10^{16}$ | 30 | $10^{19}$ |

EXAMPLE 6

A Se-doped diamond was synthesized by implanting Se ions into single crystal diamond under the following conditions: an Se acceleration voltage of 180 keV and an Se injection of $4 \times 10^{15}$ ions/cm$^2$. After annealing under vacuum, the Se-doped diamond was subjected to Hall coefficient and electrical resistivity measurements. The diamond was found to be an n-type semiconductor since it had a negative Hall coefficient value. The Se-injected area of the diamond had an average free electron density of $10^{15}$ (1/cm$^3$) and an electron mobility of 10 (cm$^2$/V.s).

EXAMPLE 7

Using a reaction gas composed of 1.0% of CH$_4$, 0.00001% to 0.01% of HCl, and the balance of H$_2$, Cl-doped diamond films having a 1.2 μm thickness were grown on the (111) face of a single crystal diamond substrate in accordance with the present invention by a known microwave plasma-assisted CVD process. The pressure in the reaction system was held at 45 Torr and the microwaves applied had a frequency of 2.45 GHz and an output of 350W.

Measurements of electrical resistivity and Hall coefficient showed that the Cl-doped epitaxial diamond films grown in Example 7 had negative Hall coefficient values and hence were n-type semiconductors. The concentration of Cl in the diamond samples was also measured by SIMS. The results of Cl/C (%) calculation, and measurements of free electron density, electron mobility, and Cl concentration are summarized in Table 5 below. The Cl concentration of sample No. 7-1 was estimated from its free electron density.

TABLE 5

| Sample No. | Cl/C (%) | Free electron density (1/cm$^3$) | Electron mobility (cm$^2$/V · s) | S concentration (1/cm$^3$) |
|---|---|---|---|---|
| 7-1 | 0.001 | 6 × 10$^{12}$ | 320 | 10$^{10}$ (estimated) |
| 7-2 | 0.02 | 9 × 10$^{14}$ | 110 | 10$^{15}$ |
| 7-3 | 0.5 | 8 × 10$^{16}$ | 30 | 7 × 10$^{17}$ |
| 7-4 | 10 | 4 × 10$^{18}$ | 0.2 | 10$^{20}$ |

EXAMPLE 8

A Cl-doped diamond was synthesized by implanting Cl ions into single-crystal diamond under the following conditions: a Cl acceleration voltage of 80 keV and a Cl injection of 2 × 10$^{14}$ ions/cm$^2$. After annealing at 5 GPa injection and 1,300° C., the Cl-doped diamond was subjected to Hall coefficient and electrical resistance measurements. The diamond had a negative Hall coefficient value and hence was found to be an n-type semiconductor.

While the invention has been described in detail and with reference to specific embodiments thereof, it will be apparent to one skilled in the art that various changes and modifications can be made therein without departing from the spirit and scope thereof.

What is claimed is:

1. A semiconducting diamond comprising diamond carbon and at least one dopant selected from the group consisting of S and Se.

2. A semiconducting diamond as claimed in claim 1, wherein the concentration of said dopant is from about 1×10$^{12}$ to 1×10$^{21}$ cm$^{-3}$ of said semiconducting diamond.

3. A semiconducting diamond as claimed in claim 2, wherein the concentration of said dopant is from 1×10$^{15}$ to 1×10$^{20}$ cm$^{-3}$ of said semiconducting diamond.

4. A semiconducting diamond as claimed in claim 1, wherein said dopant is S.

5. A semiconducting diamond as claimed in claim 1, wherein said dopant is Se.

6. A semiconducting diamond as claimed in claim 1, wherein said semiconducting diamond is an n-type semiconductor.

7. A semiconducting diamond as claimed in claim 6, wherein said semiconducting diamond has an electrical resistivity of from about 1×10$^{-2}$ to 1×10$^6$ Ωcm.

8. A semiconducting diamond as claimed in claim 6, wherein said semiconducting diamond has a free electron density of from about 1×10$^{12}$ to 1×10$^{21}$ cm$^{-3}$.

9. A semiconducting diamond as claimed in claim 6, wherein said semiconducting diamond has an electron mobility of from about 1×10$^{-1}$ to 1×10$^3$ cm$^2$/Vsec.

10. A process for producing a semiconducting diamond comprising the step of injecting an ionized substance comprising a dopant selected from the group consisting of S, Se, and Cl into a carbon diamond matrix to provide a semiconducting diamond doped with said dopant in an amount of from about 1×10$^{12}$ to 1×10$^{17}$ ions per 1 cm$^3$ of said semiconducting diamond.

11. A process for producing a semiconducting diamond comprising the steps of:
   (a) mixing a gas comprising carbon and at least one gas comprising a dopant selected from S or Se, the molar ratio of said dopant atoms to said carbon atoms being from about 0.001% to 10%; and
   (b) reacting said mixture to produce a semiconducting diamond comprising diamond carbon and said dopant.

12. A process as claimed in claim 11, wherein said mixture is reacted by a metastable vapor phase deposition reaction.

13. A process for producing a semiconducting diamond comprising the steps of:
   (a) mixing a diamond powder and at least one substance comprising a dopant selected from the group consisting of S, Se, and Cl; and
   (b) reacting said mixture at a temperature and pressure sufficient to provide a semiconducting diamond comprising diamond carbon and said dopant.

* * * * *